US012813302B2

(12) United States Patent
Chen et al.

(10) Patent No.: US 12,813,302 B2
(45) Date of Patent: Nov. 24, 2026

(54) PACKAGE SUBSTRATE AND FABRICATING METHOD THEREOF

(71) Applicant: AaltoSemi Inc., Jiangsu (CN)

(72) Inventors: Min-Yao Chen, Jiangsu (CN); Yin-Ju Chen, Jiangsu (CN); Sung-Kun Lin, Jiangsu (CN); Jiun-Hua Chiue, Jiangsu (CN); Andrew C. Chang, Jiangsu (CN); Chung-Hsier Yang, Jiangsu (CN); Zhen-Hu Chang, Jiangsu (CN)

(73) Assignee: AaltoSemi Inc., Jiangsu (CN)

( * ) Notice: Subject to any disclaimer, the term of this patent is extended or adjusted under 35 U.S.C. 154(b) by 255 days.

(21) Appl. No.: 18/886,528

(22) Filed: Sep. 16, 2024

(65) Prior Publication Data

US 2025/0096105 A1 Mar. 20, 2025

(30) Foreign Application Priority Data

Sep. 19, 2023 (CN) ......................... 202311215068.7

(51) Int. Cl.

| | |
|---|---|
| ***H10W 70/65*** | (2026.01) |
| ***H10W 70/05*** | (2026.01) |
| ***H10W 70/63*** | (2026.01) |

(52) U.S. Cl.
CPC .......... *H10W 70/65* (2026.01); *H10W 70/05* (2026.01); *H10W 70/635* (2026.01)

(58) Field of Classification Search
CPC ... H01W 70/65; H01W 70/05; H01W 72/012; H10W 70/635; H10W 70/093
See application file for complete search history.

(56) References Cited

U.S. PATENT DOCUMENTS

2016/0037634 A1* 2/2016 Chou .................. H05K 3/4007 427/97.1
2017/0047281 A1* 2/2017 Hu .......................... H10P 54/00
2018/0240743 A1* 8/2018 Lee ......................... H10P 72/74

* cited by examiner

*Primary Examiner* — Sherman Ng
(74) *Attorney, Agent, or Firm* — RANKIN, HILL & CLARK LLP

(57) ABSTRACT

A package substrate is provided, in which dielectric layers are formed on a core board, and a wiring layer is embedded in at least one of the dielectric layers, so that the wiring layer has better copper adhesion to prevent delamination problems. A method of fabricating the package substrate is also provided.

8 Claims, 8 Drawing Sheets

PACKAGE SUBSTRATE AND FABRICATING METHOD THEREOF

TECHNICAL FIELD

The present disclosure relates to a package substrate for carrying chips, and in particular, to a package substrate with embedded circuits and a fabricating method thereof.

BACKGROUND

Technologies currently used in the field of chip packaging include package module types like, for example, Chip Scale Package (CSP), Direct Chip Attach (DCA), or Multi-Chip Module (MCM) Package, etc. Typically, semiconductor chips are connected onto a package substrate.

FIG. 1 is a cross-sectional view of a conventional package substrate 1. As shown in FIG. 1, the package substrate 1 includes a core board 10 having a first side 10*a* and a second side 10*b* opposing the first side 10*a*, and the first side 10*a* and the second side 10*b* of the core board 10 are each formed with a circuit structure 11, wherein the circuit structure 11 comprises a plurality of insulating layers 111 and a plurality of circuit layers 110 formed on each of the insulating layers 111, and the core board 10 has a plurality of conductive vias 100 connecting the first side 10*a* and the second side 10*b* to electrically connect the circuit layers 110.

A wiring layer 18 and electrical contact pads 180 electrically connected to the wiring layer 18 are formed on the outermost insulating layer 111 of the circuit structure 11, so that solder bumps 16 or solder balls 19 can be implanted on the electrical contact pads 180.

However, in the conventional package substrate 1, the wiring layer 18 is formed on the insulating layer 111, which leads to poor adhesion of copper of the wiring layer 18 and the wiring layer 18 tends to delaminate.

Thus, how to overcome the problems of conventional fabricating method mentioned above has become an urgent issue to be solved.

SUMMARY

In view of various shortcomings of the prior art mentioned above, the present disclosure provides a package substrate, which includes: a core board having a first side and a second side opposing the first side, and at least one conductive via connecting the first side and the second side, wherein a first circuit layer electrically connected to the conductive via is formed on the first side and the second side of the core board; a dielectric layer formed on the first side and the second side of the core board and covering the first circuit layer; a wiring layer embedded in at least one of the dielectric layers on the first side and the second side of the core board; and conductive pillars formed in the dielectric layer and electrically connected to the wiring layer and the first circuit layer.

The present disclosure also provides a method of fabricating a package substrate, the method comprises: providing a core board having a first side and a second side opposing the first side, and at least one conductive via connecting the first side and the second side, wherein a first circuit layer electrically connected to the conductive via is formed on the first side and the second side of the core board; forming a dielectric layer on the first side and the second side of the core board to cover the first circuit layer; laminating a wiring layer into at least one of the dielectric layers on the first side and the second side of the core board; and forming conductive pillars in the dielectric layer, wherein the conductive pillars are electrically connected to the wiring layer and the first circuit layer.

In the foregoing package substrate and method, a second circuit layer electrically connected to the conductive pillars is formed on the dielectric layer, and the second circuit layer has electrical contact pads contacting the wiring layer.

In the foregoing package substrate and method, a surface of the wiring layer is flush with a surface of the dielectric layer.

In the foregoing package substrate and method, the wiring layer has annular rings corresponding to the conductive pillars.

In the foregoing package substrate and method, the wiring layer has electrical contact pads, and protrusions are formed on the electrical contact pads.

As may be seen from the above, the package substrate and fabricating method thereof of the present disclosure mainly improves copper adhesion of the wiring layer to prevent delamination problems by embedding the wiring layer in the dielectric layer.

DETAILED DESCRIPTION

Figure 1:
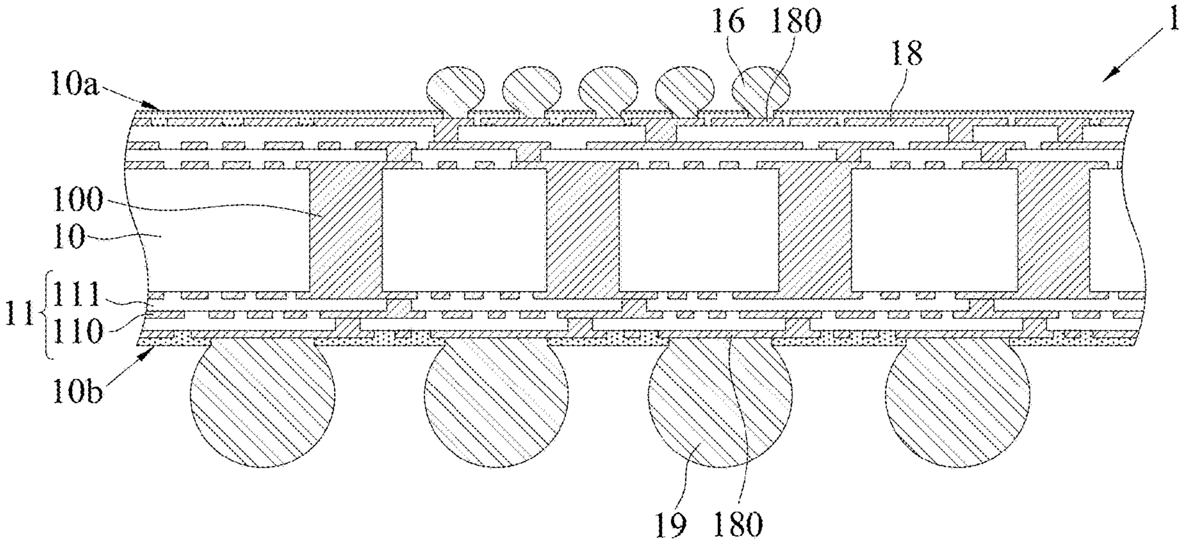
FIG. 1 (PRIOR ART)
FIG. 1 is a cross-sectional view of a conventional package substrate.

Implementations of the present disclosure are illustrated below by embodiments. Those skilled in the art may easily understand other advantages and effects of the present disclosure from the content disclosed in this specification.

It should be noted that the structures, proportions, sizes, etc. depicted in the drawings appended to this specification are only used in coordination with the content disclosed in the specification for those skilled in the art to understand and read. They are not used to limit specific condition of implementing this disclosure, and therefore have no substantial technical meaning. Without affecting the effects created and the purposes achieved by this disclosure, any modification, change, or adjustments in structures, proportions, or sizes shall still fall within the scope of the technical content disclosed herein. Meanwhile, terms such as "on," "first," "second," "one," "a," and the like cited in this specification are only for illustrating clearly and are not used to limit the implementable scope of the present disclosure. Without substantial change in the technical content, changes or adjustments of their relative relationships shall also be regarded as within the implementable scope of the present disclosure.

FIG. 2A to FIG. 2G are schematic cross-sectional views illustrating a fabricating method of a package substrate 2 according to the first embodiment of the present disclosure.

Figure 2A:
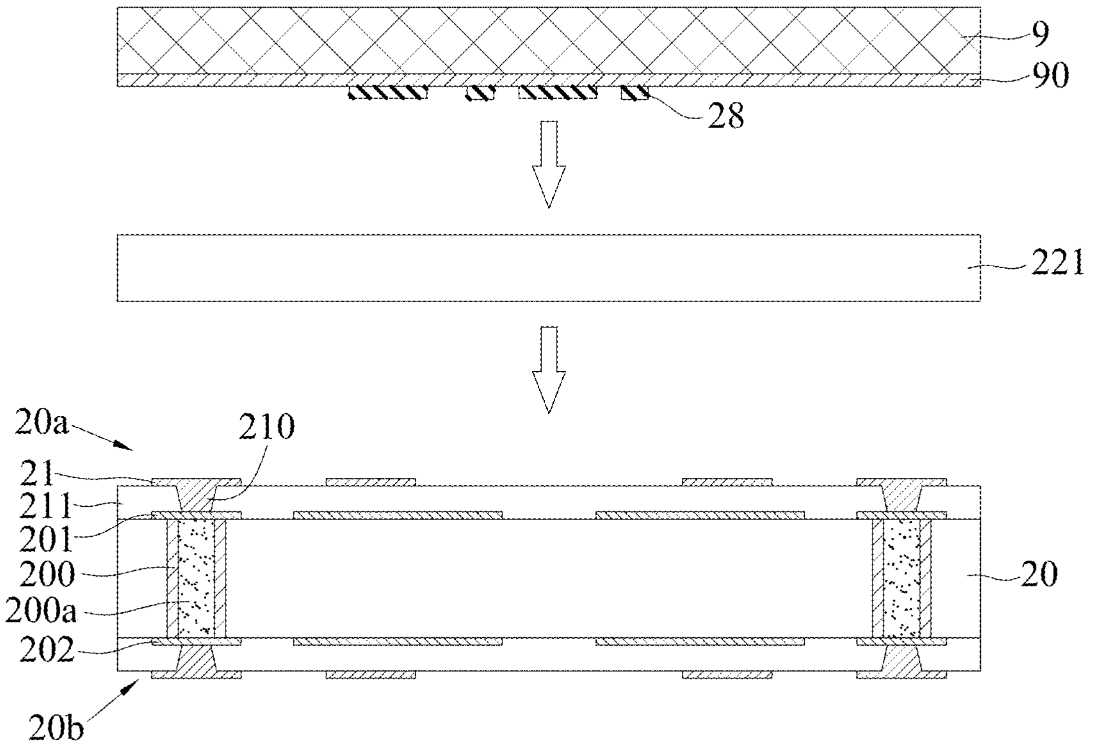
FIG. 2A to FIG. 2G are schematic cross-sectional views illustrating a fabricating method of a package substrate according to the first embodiment of the present disclosure.

As shown in FIG. 2A, a core board 20 and a carrier 9 are provided. The core board 20 has a first side 20*a* and a second side 20*b* opposing the first side 20*a*, and inner circuit layers 201, 202 are formed on the first side 20*a* and the second side 20*b* of the core board 20, respectively, and the core board 20 has a plurality of conductive vias 200 connecting the first side 20*a* and the second side 20*b*, so that the conductive vias 200 are electrically connected to the inner circuit layers 201, 202.

In an embodiment, the core board 20 may be an organic polymer board comprising bismaleimide triazine (BT), prepreg (PP) material with glass fiber, or the core board 20 can be a board made of other materials. The conductive vias 200 are hollow columns, and the hollow portions of the conductive vias 200 may be filled with plugging material 200*a*, wherein the plugging material 200*a* may be of various types, such as conductive adhesive, ink, etc., without specific limitation. It should be understood that in other embodiments, the conductive vias 200 may also be solid metal columns without being filled with the plugging material 200*a*.

Furthermore, the core board 20 may be formed, using build-up process, with at least one insulating layer 211 formed on the first side 20*a* and the second side 20*b* respectively, a first circuit layer 21 formed on the insulating layer 211, and a plurality of conductive blind vias 210 disposed in the insulating layer 211 and electrically connected to the inner circuit layers 201, 202 and the first circuit layer 21. For example, the insulating layer 211 is a dielectric layer made of such as Ajinomoto build-up film (ABF), polybenzoxazole (PBO), polyimide (PI), prepreg (PP), or other dielectric materials. The first circuit layer 21 and the conductive blind vias 210 may be integrally formed by electroplating metal (such as copper) or other methods.

It should be understood that the number of layers of the first circuit layer 21 may be designed according to requirements without limited by above.

Also, the carrier 9 has a metal layer 90 thereon, and a wiring layer 28 is formed on the metal layer 90. For example, the metal layer 90 and the wiring layer 28 are both made of copper.

Figure 2B:
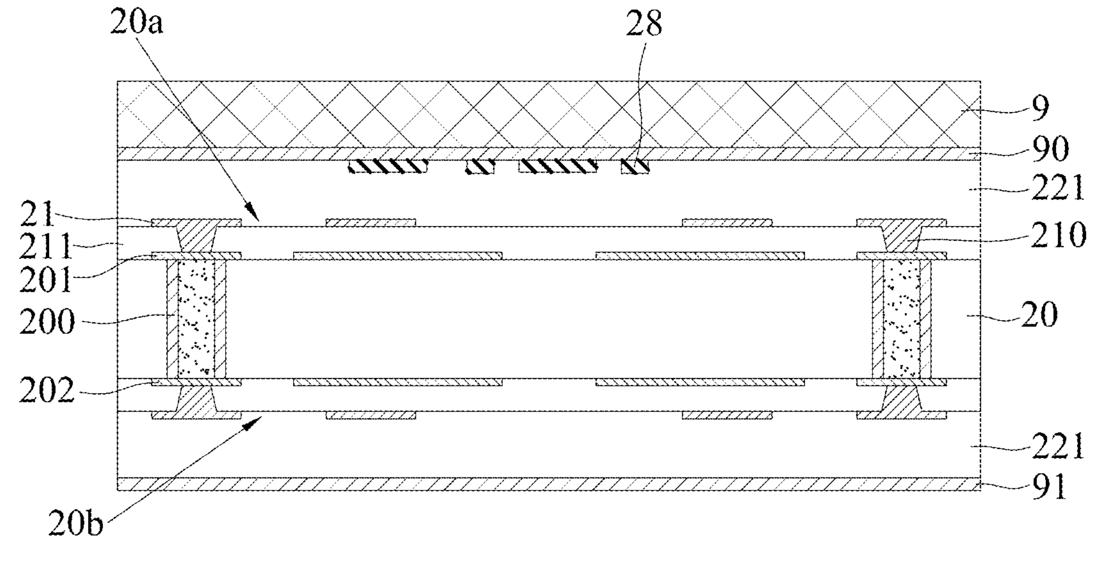

As shown in FIG. 2B, the wiring layer 28 of the carrier 9 is laminated onto the insulating layer 211 of the first side 20*a* of the core board 20 via a dielectric layer 221, so that the wiring layer 28 is embedded in the dielectric layer 221, and the metal layer 90 is bonded onto the dielectric layer 221, and another dielectric layer 221 is formed on the insulating layer 211 of the second side 20*b* of the core board 20, and therefore the dielectric layer 221 covers the first circuit layer 21, so that the first circuit layer 21 of the first side 20*a* of the core board 20 and the first circuit layer 21 of the second side 20*b* of the core board 20 are embedded in the dielectric layers 221.

In an embodiment, the dielectric layer 221 is formed on the insulating layer 211 of the second side 20*b* of the core board 20 by lamination. For example, the dielectric layer 221 is bonded to another metal layer 91 such as a copper layer, so that the dielectric layer 221 is bonded to the insulating layer 211 and the first circuit layer 21 by means of fusion and lamination.

Furthermore, the dielectric layer 221 is made of such as Ajinomoto build-up film (ABF), polybenzoxazole (PBO), polyimide (PI), prepreg (PP), or other dielectric materials. For example, the materials forming the insulating layer 211 and the dielectric layer 221 may be the same or different.

Figure 2C:
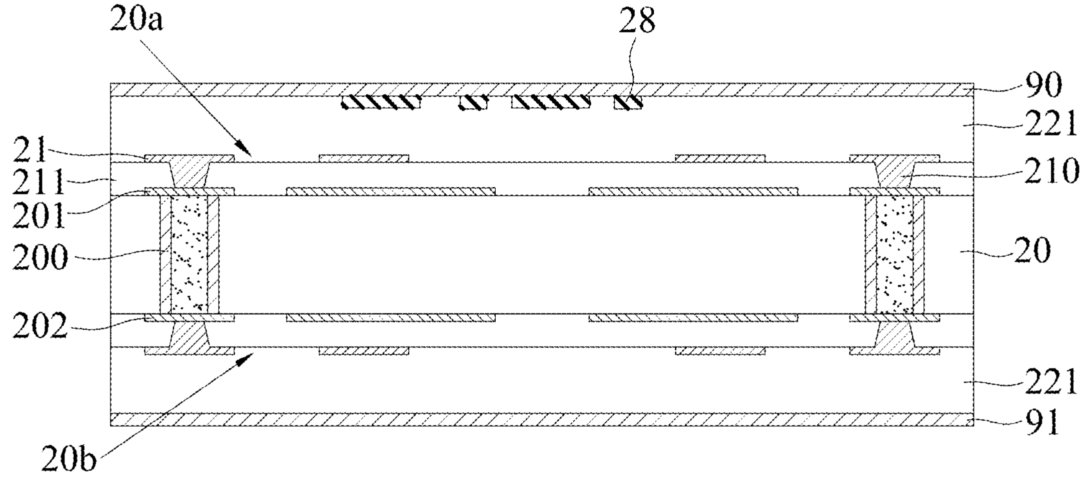

As shown in FIG. 2C, the carrier 9 is removed and the metal layers 90, 91 are retained on the dielectric layers 221.

Figure 2D:
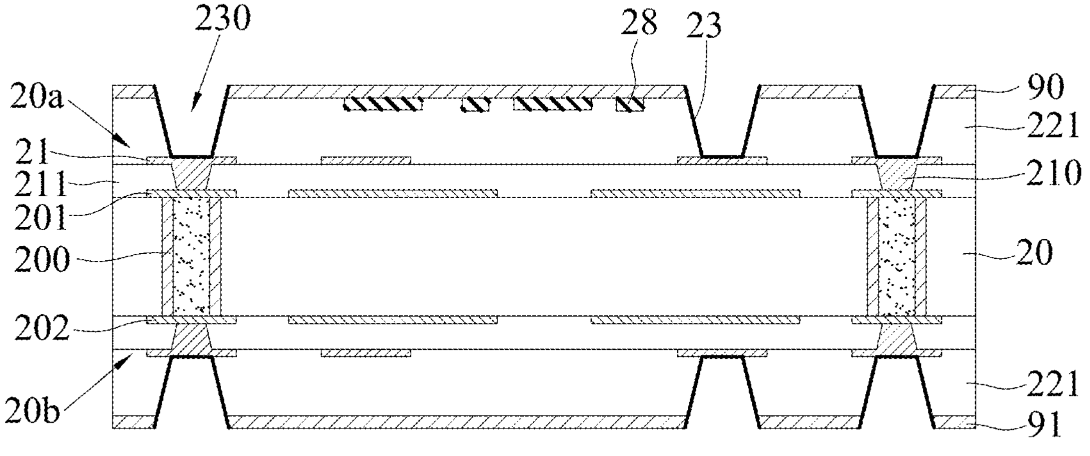

As shown in FIG. 2D, a plurality of openings 230 are formed on each of the dielectric layers 221 and penetrate through the metal layers 90, 91, so that part of the surface of each of the first circuit layers 21 is exposed from the openings 230. Then, a seed layer 23 is formed on the wall surface of each of the openings 230.

In an embodiment, laser burning is employed to form the openings 230, and copper material is formed on the wall surface of each of the openings 230 as the seed layer 23 by means of plating.

Figure 2E:
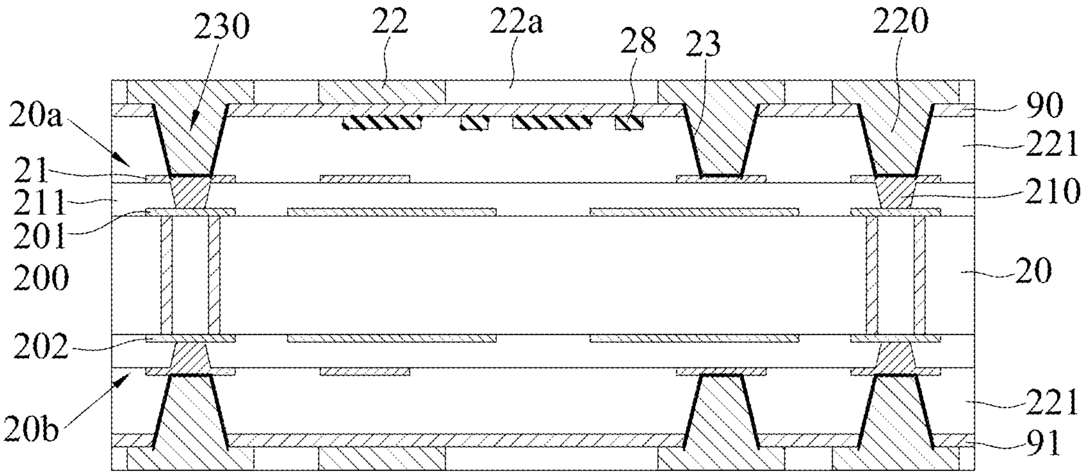

As shown in FIG. 2E, a patterned circuit process is performed to the metal layers 90, 91 and the seed layers 23 to form a second circuit layer 22 on each of the dielectric layers 221, and a plurality of conductive pillars 220 electrically connected to the second circuit layer 22 and the first circuit layer 21 are formed in the openings 230. Then, the exposed portions of the metal layers 90, 91 not covered by the second wiring layers 22 are removed to expose part of the surfaces of the dielectric layers 221 and the wiring layer 28.

Figure 2F:
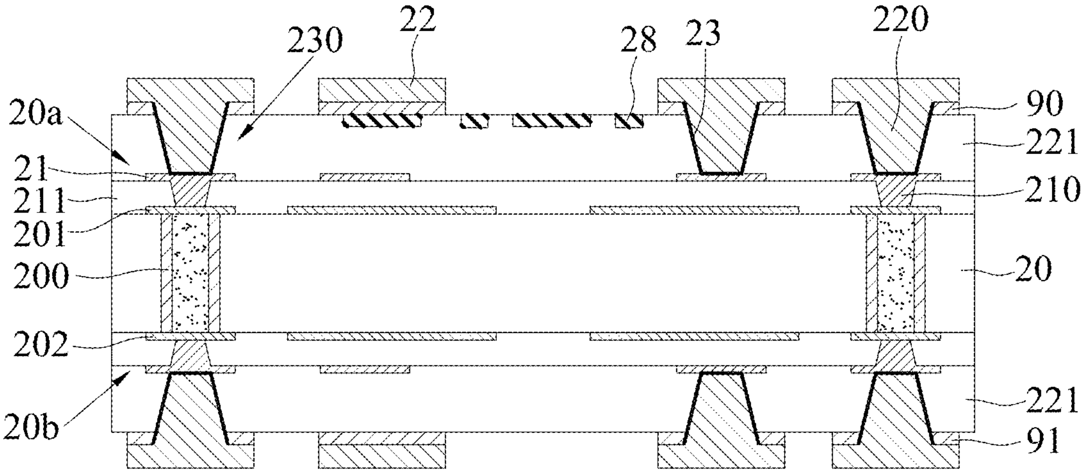

In an embodiment, a patterned resistance layer 22*a* such as a dry film may be formed on each of the dielectric layers 221 to expose the openings 230 and part of the surfaces of the metal layers 90, 91, and then copper is electroplated in the openings 230 and on part of the surfaces of the metal layers 90, 91. Then the patterned resistance layers 22*a* are stripped, and then the metal layers 90, 91 underneath are flash etched to form the second circuit layers 22 and the conductive pillars 220, as shown in FIG. 2F.

Furthermore, the wiring layer 28 is in contact with and electrically connected to part of the second circuit layer 22, and the surface of the wiring layer 28 is flush with the surface of the dielectric layer 221.

Figure 2G:
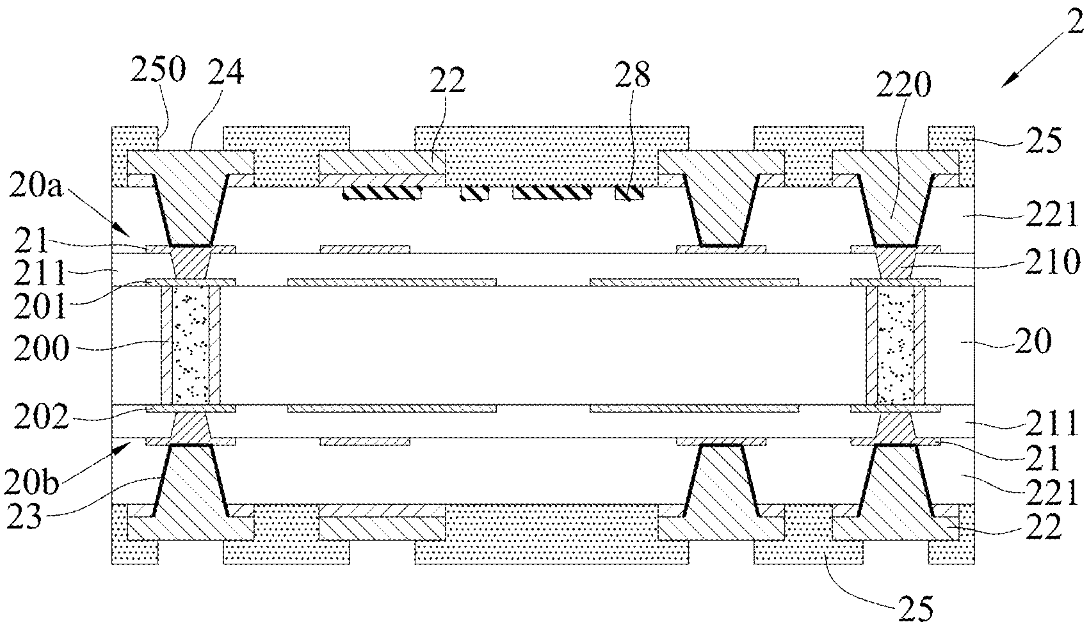

As shown in FIG. 2G, a solder mask layer 25 having a plurality of openings 250 is formed on each of the dielectric layers 221, so that part of the surface of each of the second circuit layers 22 is exposed from the openings 250 as electrical contact pads 24 to form the asymmetric package substrate 2.

Therefore, the fabricating method of the present disclosure is to embed the wiring layer 28 in the dielectric layer 221, in order to increase the wiring density. Also, the electrical contact pads 24 are protruded out on the dielectric layer 221 to allow a solder material (not shown) to be formed on the electrical contact pads 24 in the following process, so the package substrate 2 of the present disclosure is suitable for implanting micro-sized solder balls in the openings 250 of the solder mask layer 25.

Furthermore, copper is electroplated on the embedded form wiring layer 28 to form the electrical contact pads 24, so that the wiring layer 28 has better copper adhesion.

FIG. 3A to FIG. 3F are schematic cross-sectional views illustrating a fabricating method of a package substrate 3 according to the second embodiment of the present disclosure. The difference between the second embodiment and the first embodiment is the fabricating process of both sides of the core board 20. The other fabricating processes are mainly the same, so the similarities will not be repeated.

Figure 3A:
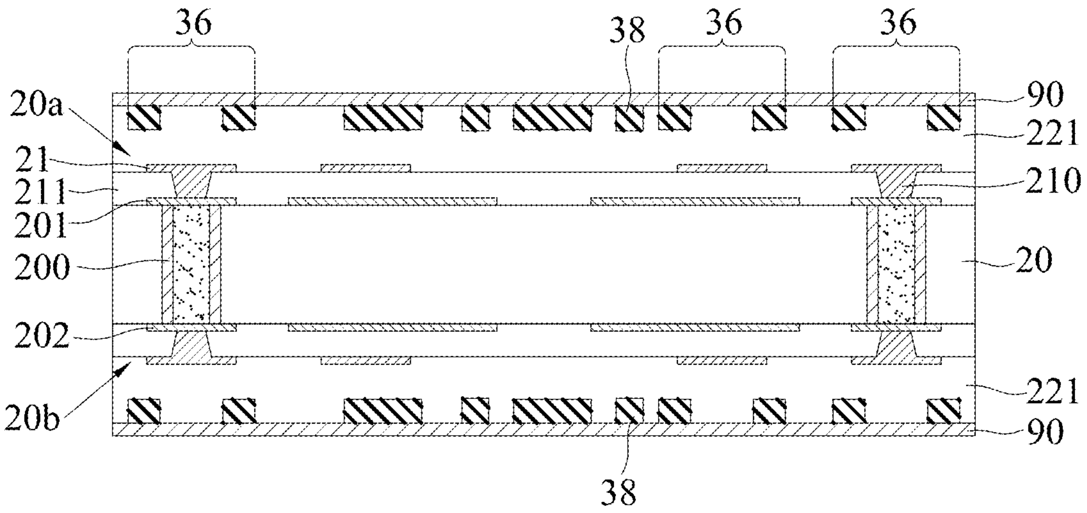
FIG. 3A to FIG. 3F are schematic cross-sectional views illustrating a fabricating method of a package substrate according to the second embodiment of the present disclosure.

As shown in FIG. 3A, the processes illustrated in FIG. 2A to FIG. 2C are employed. On the first side 20*a* and the second side 20*b* of the core board 20, the dielectric layers 221 are bonded with the carrier 9 by fusion and lamination respectively, so that wiring layers 38 are embedded in the dielectric layers 221. Then, the carriers 9 are removed and the metal layers 90 are retained on the dielectric layers 221.

In an embodiment, a plurality of annular rings 36 are formed on the carrier 9 and may be fabricated along with the wiring layer 38.

Figure 3B:
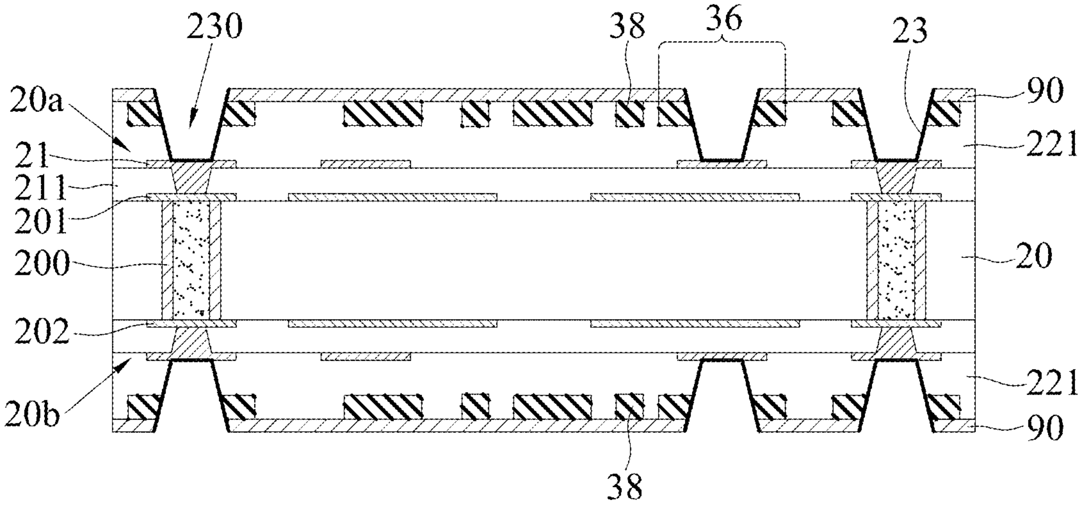

As shown in FIG. 3B, the process illustrated in FIG. 2D is employed. Laser is aligned at the annular rings 36 and penetrates through the metal layers 90 to form a plurality of openings 230 on each of the dielectric layers 221, so that part of the surface of each of the first circuit layers 21 is exposed from the openings 230. Then, a seed layer 23 is formed on the wall surface of each of the openings 230.

Figure 3C:
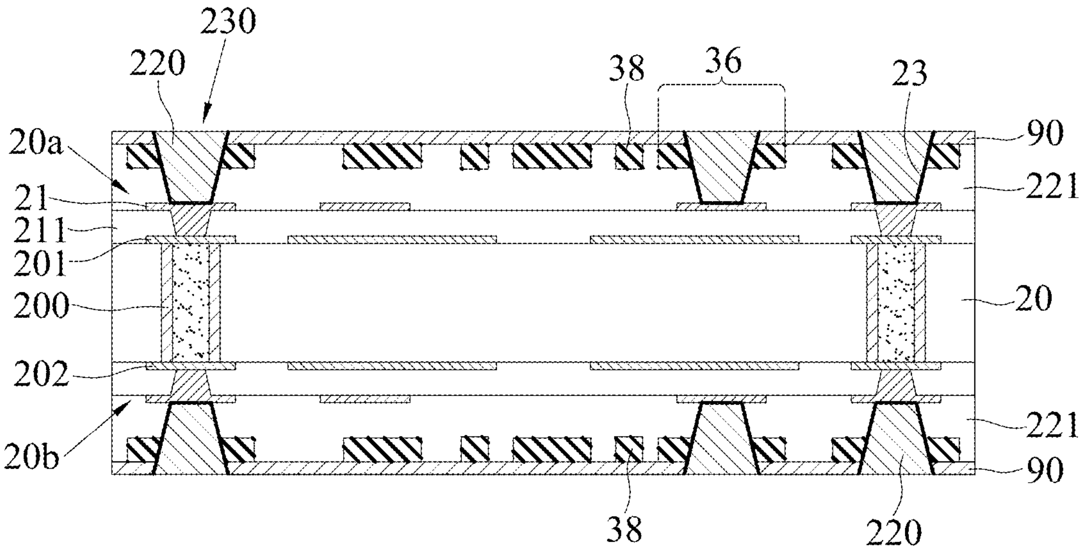

As shown in FIG. 3C, the process illustrated in FIG. 2E is employed. Electroplating process is performed the metal layers 90 and the seed layers 23 to form a plurality of conductive pillars 220 electrically connected to the wiring layer 38 and the first circuit layer 21 in the openings 230.

Figure 3D:
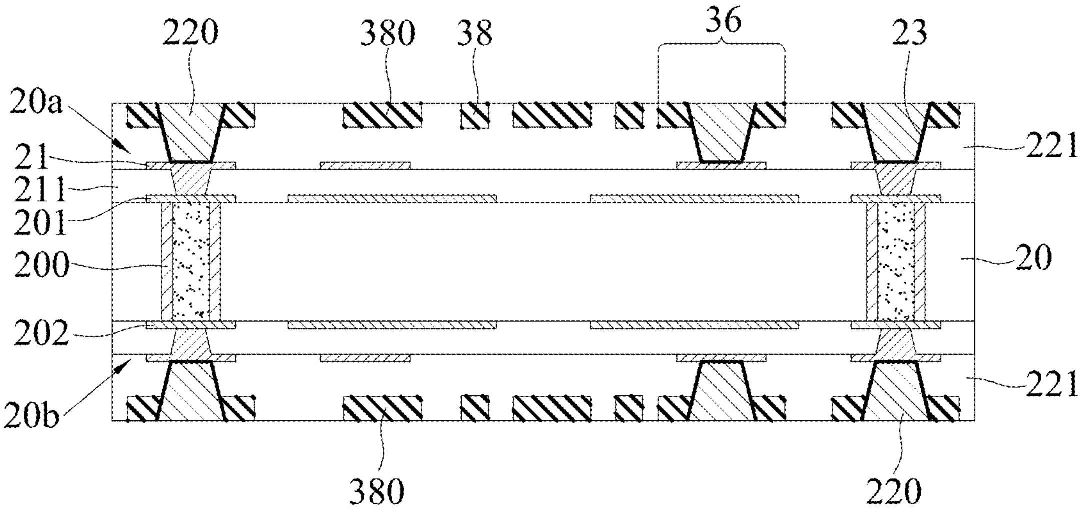

As shown in FIG. 3D, the metal layer 90 and other metal materials on each of the dielectric layers 221 are etched and removed, so that the surface of the wiring layer 38 and the end surfaces of the conductive pillars 220 are exposed from the surface of the dielectric layer 221, wherein the wiring layer 38 is formed with a plurality of electrical contact pads 380.

In an embodiment, the surface of the wiring layer 38, the end surfaces of the conductive pillars 220 and the surface of the dielectric layer 221 are coplanar.

Figure 3E:
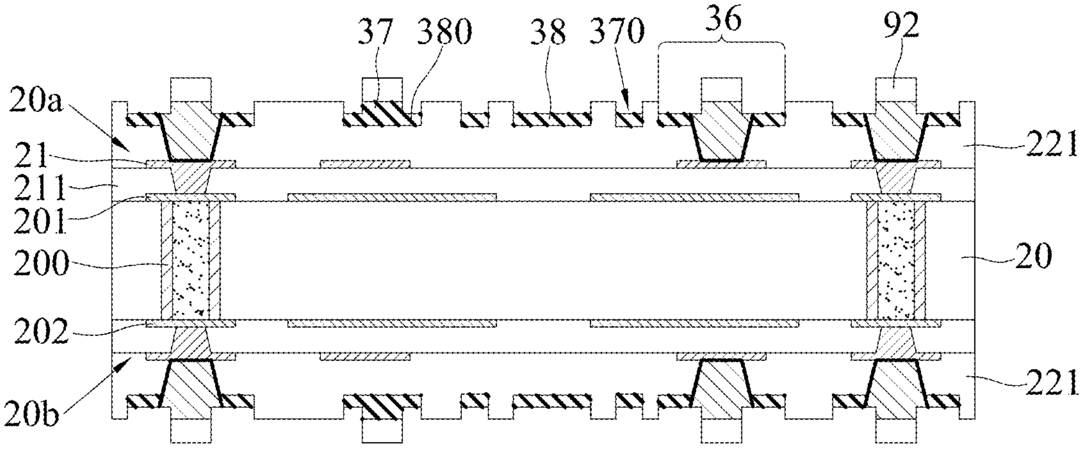

As shown in FIG. 3E, part of the material of each of the electrical contact pads 380 is etched and removed via a patterned resistance layer 92 such as a dry film, so as to form a protrusion 37 on each of the electrical contact pads 380, and grooves 370 are formed on each of the dielectric layers 221.

In an embodiment, the surface of each of the electrical contact pads 380 is lower than the surface of the dielectric layer 221, and the surface of each of the protrusions 37 is flush with the surface of the dielectric layer 221.

Figure 3F:
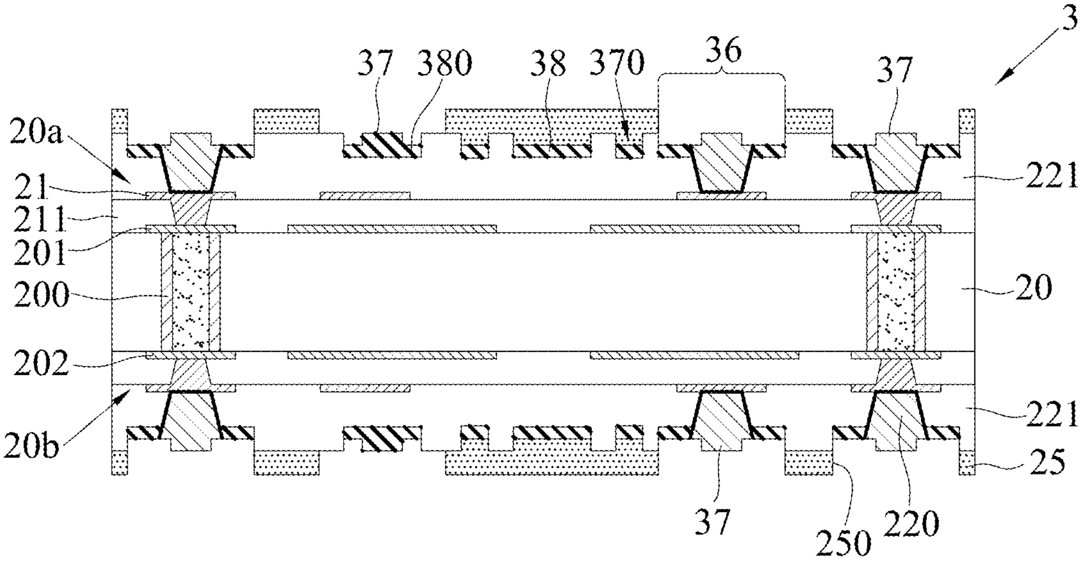

As shown in FIG. 3F, the patterned resistance layers 92 are removed, and a solder mask layer 25 having a plurality of openings 250 is formed on each of the dielectric layers 221, so that each of the electrical contact pads 380 and the protrusion 37 thereon are exposed from the opening 250 to form the symmetric package substrate 3.

Therefore, the fabricating method of the present disclosure is to embed the wiring layer 38 and the electrical contact pads 380 thereof in the dielectric layer 221, so that the wiring layer 38 has better copper adhesion, and the package substrate 3 is suitable for disposing external solder bumps (not shown) on the wiring layer 38.

Furthermore, the annular rings 36 are fabricated on the carrier 9 to allow laser alignment, so the openings 230 of the package substrate 3 are suitable for small-sized laser apertures.

Also, the wiring layers 38 are embedded in the dielectric layers 221 on both the opposite sides of the package substrate 3. Therefore, compared to the prior art, the thickness of the package substrate 3 is thinner, allowing miniaturization requirement.

In addition, by forming the protrusions 37 on the electrical contact pads 380, the specific surface area of each of the electrical contact pads 380 is increased and improves the adhesion of the solder balls. Therefore, when the solder balls (not shown) are subsequently formed on the electrical contact pads 380, the solder balls cover the electrical contact pads 380 and the protrusions 37 to increase the connection reliability between the solder balls and the electrical contact pads 380.

The present disclosure also provides a package substrate 2, 3, which comprises: a core board 20 having a first side 20*a* and a second side 20*b* opposing the first side 20*a*, a dielectric layer 221 formed on the core board 20, a wiring layer 28, 38 embedded in the dielectric layer 221, and conductive pillars 220 disposed in the dielectric layer 221.

The core board 20 has at least one conductive via 200 connecting the first side 20*a* and the second side 20*b*, and a first circuit layer 21 electrically connected to the conductive via 200 is formed on the first side 20*a* and the second side 20*b* of the core board 20.

The dielectric layer 221 is formed on the first side 20*a* and the second side 20*b* of the core board 20 to cover the first circuit layer 21.

The wiring layer 28, 38 is embedded in at least one of the dielectric layers 221 on the first side 20*a* and the second side 20*b* of the core board 20.

The conductive pillars 220 are formed in the dielectric layer 221 to electrically connect the wiring layer 28, 38 and the first circuit layer 21.

In one embodiment, a second circuit layer 22 electrically connected to the conductive pillars 220 is formed on the dielectric layer 221, and the second circuit layer 22 has electrical contact pads 24 contacting the wiring layer 28.

In one embodiment, the surface of the wiring layer 28, 38 is flush with the surface of the dielectric layer 221.

In one embodiment, the wiring layer 38 has annular rings 36 corresponding to the conductive pillars 220.

In one embodiment, the wiring layer 38 has electrical contact pads 380, and protrusions 37 are formed on the electrical contact pads 380.

In summary, the package substrate and fabricating method thereof of the present disclosure is to embed the wiring layer in the dielectric layer, so that the wiring layer has better copper adhesion to prevent delamination problems.

The above embodiments are used to exemplarily illustrate the principles and effects of the present disclosure, but are not used to limit the present disclosure. Anyone skilled in the art may perform modifications to the above embodiments without departing from the spirit and scope of the present disclosure. Therefore, the scope claimed of the present disclosure should be defined by the following claims.

What is claimed is:

1. A package substrate, comprising: a core board having a first side and a second side opposing the first side, and at least one conductive via connecting the first side and the second side, wherein a first circuit layer electrically connected to the conductive via is formed on the first side and the second side of the core board; a dielectric layer formed on the first side and the second side of the core board and covering the first circuit layer; a wiring layer embedded in at least one of the dielectric layers on the first side and the second side of the core board; and conductive pillars formed in the dielectric layer and electrically connected to the wiring layer and the first circuit layer, wherein the wiring layer has annular rings corresponding to the conductive pillars.

2. The package substrate of claim 1, wherein a second circuit layer electrically 15 connected to the conductive pillars is formed on the dielectric layer, and the second circuit layer has electrical contact pads contacting the wiring layer.

3. The package substrate of claim 1, wherein a surface of the wiring layer is flush with a surface of the dielectric layer.

4. The package substrate of claim 1, wherein the wiring layer has electrical contact pads, and protrusions are formed on the electrical contact pads.

5. A method of fabricating a package substrate, comprising: providing a core board having a first side and a second side opposing the first side, and at least one conductive via connecting the first side and the second side, wherein a first circuit layer electrically connected to the conductive via is formed on the first side and the second side of the core board; forming a dielectric layer on the first side and the second side of the core board to cover the first circuit layer;

laminating a wiring layer into at least one of the dielectric layers on the first side and the second side of the core board; and forming conductive pillars in the dielectric layer, wherein the conductive pillars are electrically connected to the wiring layer and the first circuit layer, and wherein the wiring layer has annular rings corresponding to the conductive pillars.

6. The method of claim 5, wherein a second circuit layer electrically connected to the conductive pillars is formed on the dielectric layer, and the second circuit layer has electrical contact pads contacting the wiring layer.

7. The method of claim 5, wherein a surface of the wiring layer is flush with a surface of the dielectric layer.

8. The method of claim 5, wherein the wiring layer has electrical contact pads, and protrusions are formed on the electrical contact pads.

* * * * *